US007967915B2

(12) United States Patent
Sauar et al.

(10) Patent No.: US 7,967,915 B2

(45) Date of Patent: Jun. 28, 2011

(54) REDUCTION OF ATTRACTION FORCES BETWEEN SILICON WAFERS

(75) Inventors: Erik Sauar, Oslo (NO); Per Arne Wang, Porsgrunn (NO)

(73) Assignee: REC Scanwafer AS, Porsgrunn (NO)

( * ) Notice: Subject to any disclaimer, the term of this patent is extended or adjusted under 35 U.S.C. 154(b) by 185 days.

(21) Appl. No.: 11/988,132

(22) PCT Filed: Jun. 26, 2006

(86) PCT No.: PCT/NO2006/000244

§ 371 (c)(1), (2), (4) Date: Mar. 21, 2008

(87) PCT Pub. No.: WO2007/004890

PCT Pub. Date: Jan. 11, 2007

(65) Prior Publication Data

US 2009/0117713 A1 May 7, 2009

Related U.S. Application Data

(60) Provisional application No. 60/695,451, filed on Jul. 1, 2005.

(51) Int. Cl.
*B08B 7/00* (2006.01)
*H01L 21/70* (2006.01)

(52) U.S. Cl. ........................................... 134/7; 438/458

(58) Field of Classification Search .................. 134/6, 7; 438/424, 464, 465, 460, 458
See application file for complete search history.

(56) References Cited

U.S. PATENT DOCUMENTS 5,213,451 A * 5/1993 Frank et al. ..................... 406/72
6,210,795 B1 * 4/2001 Nelson et al. ................. 428/347
6,420,211 B1 7/2002 Brunet et al.

FOREIGN PATENT DOCUMENTS

CN 1333919 A 1/2002
DE 102 20 468 A1 11/2003
JP 2002-036090 A 6/2002

* cited by examiner

*Primary Examiner* — Michael Kornakov
*Assistant Examiner* — Natasha Campbell
(74) *Attorney, Agent, or Firm* — Birch, Stewart, Kolasch & Birch, LLP

(57) ABSTRACT

A method for reducing attraction forces between wafers (4) is provided. This method includes the step of, after sawing and before dissolution of the adhesive (5), introducing spacers (6) between wafers (4). A wafer singulation method and an agent for use in the method are also provided.

13 Claims, 2 Drawing Sheets

REDUCTION OF ATTRACTION FORCES BETWEEN SILICON WAFERS

BACKGROUND OF THE INVENTION

1. Field of the Invention

The present invention comprises a method for reducing the attraction forces between wafers. The attraction forces are caused by fluid cohesion, material adhesion, surface tensions, viscous shear, etc. This attraction forces are reduced when the distance between adjacent wafers is increased.

2. Description of the Background Art

Silicon wafers are generally produced by cutting thin slices (wafers) out of a larger silicon block by means of thin wires and a slurry containing abrasive particles. After the wafers have been sawed they are still glued (with adhesive bonding) to the carrying structure on one side. When this adhesive is released, the spacing between the wafers tends to collapse, and the surface forces between adjacent wafers make it difficult to pull the wafers apart without breaking them. The process of taking the wafers apart from each other is often referred to as singulation or separation.

In order to reduce the manufacturing costs of crystalline silicon wafers, the photovoltaic industry is continuously trying to reduce the wafer thickness. As a consequence of this, the surfaces of the wafers are also becoming flatter and flatter. Hence, the surface forces are expected to increase in the future, while the mechanical resistance of the wafers is reduced due to reduced thickness.

SUMMARY OF THE INVENTION

The method for reducing attraction forces between wafers according to the invention is characterized in that it comprises the step of, after sawing and before dissolution of the adhesive, introducing spacers between wafers.

By introducing spacers between the wafers before the adhesive is removed, a certain distance between the wafers will be maintained after the adhesive is removed. The major part of the above mentioned attraction forces will hence be reduced, and the wafers will be more easily separated from each other.

There are many possible ways to separate the wafers. The large majority of these methods (whether manual or automatic) will benefit from the addition of spacers.

In an embodiment of the invention the spacers consist of multiple bodies dispersed in a fluid. This fluid can be a liquid or gas, and in one embodiment of the invention, it comprises a wafer washing solution. It is also possible to introduce the spacers between wafers after washing, in this case the fluid need not be a wafer washing solution. In an embodiment of the invention, the fluid comprises a water based solution, and in a variant of this embodiment the fluid comprises 90% water. Other embodiments comprise fluid in the form of glycol based solutions, oil based solutions, etc.

The bodies are in one embodiment of the invention substantially spherical. In another embodiment, they are semispherical, or flake shaped or tubular. Any regular geometry for the bodies will in principle be satisfactory.

The size of the bodies can vary between 1 and 180 micrometers in diameter, and it is possible to introduce bodies with different diameters. Said bodies with different diameters can be introduced simultaneously (e.g. in the case where bodies with different diameters are dispersed in a fluid) or sequentially (that is introducing different fluids with bodies of substantially the same diameter for each fluid). The density of the bodies will in one embodiment of the invention lie between 0.1 g/cm$^3$ and 3 g/cm$^3$. In a variant of this embodiment, the density will be between 0.5 g/cm$^3$ and 1.5 g/cm$^3$.

The invention comprises, apart from the above mentioned method, a method for wafer singulation and an agent for reducing attraction forces between wafers. The wafer singulation method according to the invention is characterized in that it comprises: 1) reducing the above mentioned attractive forces by introduction of spacers between wafers in a stack, 2) removing the end wafer from the stack, 3) repeating steps 1-2 for the next wafer in the stack.

The term "end wafer" in the present specification relates to a wafer situated on one end of the stack, independently of the stack's orientation (vertical or horizontal). This wafer will normally be called "upper" or "lower" wafer, which coincides with the wafer's actual position if the stack is vertical, but which does not coincide with this for wafers situated in a row (horizontal stack).

In one embodiment of the invention, the method comprises flushing the end wafer in the stack free for spacers. In a variant of this embodiment, the method comprises flushing only one surface of the end wafer, while in another embodiment it comprises flushing both surfaces of the end wafer.

BRIEF DESCRIPTION OF THE DRAWINGS

The invention will now be described by means of an embodiment shown in the figures. This embodiment is only an example and is by no means limiting for the scope of the present application.

DETAILED DESCRIPTION OF THE ILLUSTRATED EMBODIMENTS

Figure 1:
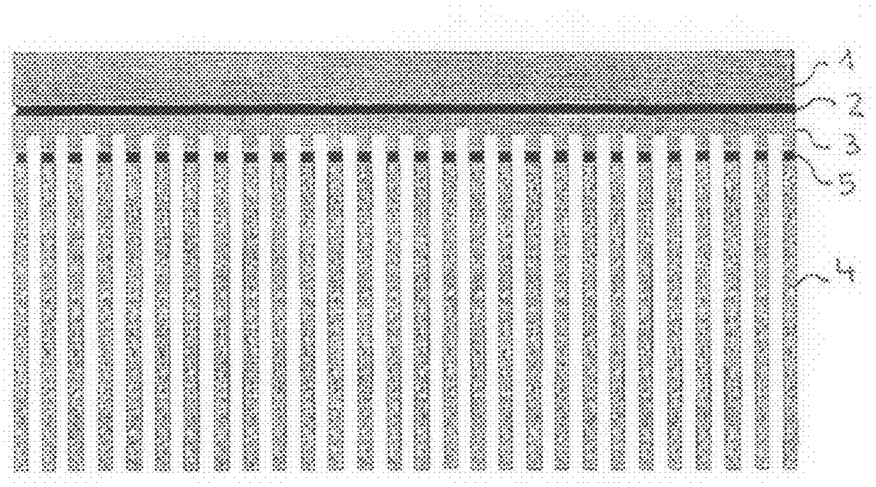
FIG. 1 shows a silicon block after sawing.

FIG. 1 shows the point of departure for the method according to the invention. The block has been cut into slices 4 which are fastened to a glass sheet 3. Two layers of adhesive are present at this stage, a first layer 2 situated between a carrying structure 1 and a glass sheet 3 and a second layer 5 situated between glass sheet 3 and the individual slices 4.

Figure 2:
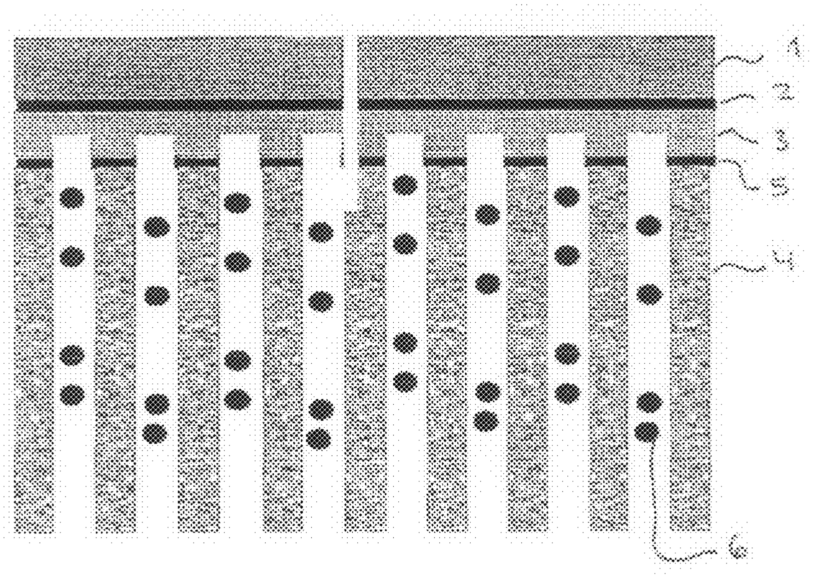
FIG. 2 shows spacers introduced between wafers.

FIG. 2 shows how, before adhesive layer 5 is removed, spacers 6 are introduced between the wafers to keep these apart from one another, and thus reduce superficial attractive forces between them. In one embodiment of the invention, spacers 6 are particles dispersed in a fluid, which fluid can be gas or liquid. In the case said fluid is gas, it will be necessary to provide a fluid for washing the wafers after removal of adhesive layer 5. Spacers 6 are flushed into the interstices between wafers together with the fluid.

In an embodiment of the invention, the bodies are substantially spherical with a diameter of between 1 and 180 micrometers and with a density of between 0.5 g/cm$^3$ and 2 g/cm$^3$. Possible materials for the bodies are plastic or glass. Other materials are e.g. alginate, synthetic polymers e.g. vinyl polymers, phenol microballs, monodisperse particles, silicon carbide particles. It is possible to operate with particles of approximately the same size, and also with different sizes of particles, which can be used simultaneously or sequentially.

Non-spherical bodies can also be used.

Figure 3:
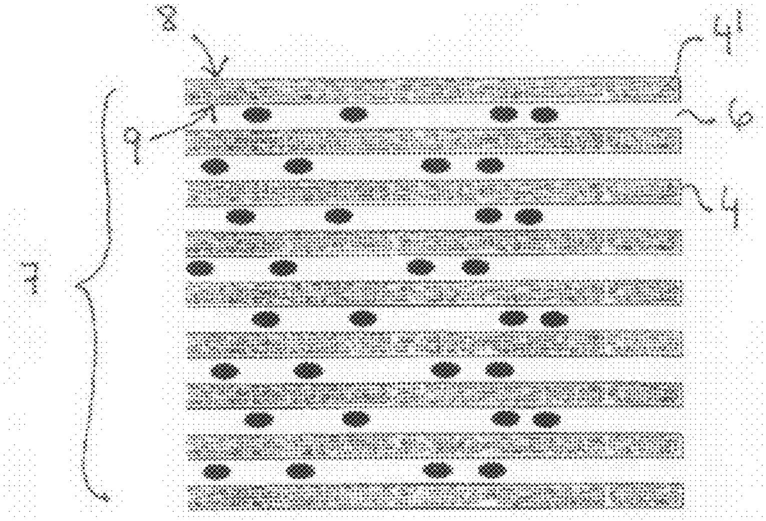
FIG. 3 shows the wafers after removal of the adhesive.

FIG. 3 shows a stack of wafers with spacers provided in the interstices between wafers. In a singulation process according to the invention the upper (or the lower) wafer in the stack (4') is flushed on one or on both its upper (8) and lower (9) surface. After this the upper (or lower) wafer is removed from the stack. This step may be performed e.g. by pushing the wafer out of the stack by means of the flushing fluid or an auxiliary fluid.

Once the upper (or the lower) wafer is removed from the stack, the process is repeated for the next wafer in the stack.

The invention claimed is:

1. A method for reducing attraction forces between wafers cut out of a silicon block and bonded to a carrying structure by means of an adhesive on one side, comprising the step of before dissolution of the adhesive, introducing spacers between wafers, wherein the spacers consist of multiple bodies dispersed in a fluid.

2. The method according to claim 1, wherein the bodies are substantially spherical, semi-spherical or tubular.

3. The method according to claim 1, wherein the fluid is a liquid or a gas.

4. The method according to claim 1, wherein the fluid is a liquid with water contents equal to or higher than 90%.

5. The method according to claim 3, wherein the fluid consists of a wafer cleaning solution.

6. The method according to claim 1, wherein the spacers have a size of between 1 and 180 micrometers.

7. The method according to claim 1, further comprising simultaneously introducing spacers with different or similar size.

8. The method according to claim 1, further comprising sequentially introducing spacers with different or similar size.

9. The method according to claim 1, wherein the density of the bodies is in the range of between 0.1 $g/cm^3$ and 3 $g/cm^3$.

10. The method according to claim 9, wherein the density of the bodies is in the range of between 0.5 $g/cm^3$ and 1.5 $g/cm^3$.

11. A wafer singulation method, comprising the following steps:

1) reducing wafer attraction forces in a stack of wafers by means of a method according to one of the preceding claims,
2) removing the end wafer from the stack,
3) repeating steps 1-2 for the next wafer in the stack; and flushing the end wafer in the stack free from spacers before removing the end wafer from the stack.

12. The method according to claim 11, further comprising flushing one surface of the end wafer.

13. The method according to claim 11, further comprising flushing both surfaces of the end wafer.

* * * * *